(12) United States Patent
Nagasaka

(10) Patent No.: US 8,957,677 B2
(45) Date of Patent: Feb. 17, 2015

(54) MAGNETIC FIELD MEASURING APPARATUS

(75) Inventor: Kimio Nagasaka, Hokuto (JP)

(73) Assignee: Seiko Epson Corporation (JP)

( * ) Notice: Subject to any disclaimer, the term of this patent is extended or adjusted under 35 U.S.C. 154(b) by 444 days.

(21) Appl. No.: 12/914,232

(22) Filed: Oct. 28, 2010

(65) Prior Publication Data

US 2011/0101974 A1 May 5, 2011

(30) Foreign Application Priority Data

Oct. 29, 2009 (JP) ................................ 2009-249436

(51) Int. Cl.
*G01R 33/02* (2006.01)
*G01V 3/00* (2006.01)
*G01R 33/032* (2006.01)

(52) U.S. Cl.
CPC ................................ *G01R 33/0322* (2013.01)
USPC ......... 324/244.1; 324/244; 324/304; 324/305

(58) Field of Classification Search
CPC ........... G01R 33/0322; G01R 33/0327; G01R 33/022; G01R 33/032; G01R 33/0325
USPC ................. 505/162, 484; 385/142; 324/244.1
See application file for complete search history.

(56) References Cited

U.S. PATENT DOCUMENTS

| | | | |
|---|---|---|---|
| 3,778,700 A | | 12/1973 | Bayley et al. |
| 3,863,144 A | * | 1/1975 | Simpson et al. ............... 324/301 |
| 5,952,818 A | * | 9/1999 | Zhang et al. .................... 324/96 |
| 7,656,154 B2 | * | 2/2010 | Kawabata et al. .......... 324/244.1 |
| 8,212,556 B1 | * | 7/2012 | Schwindt et al. ............. 324/304 |
| 2007/0252995 A1 | * | 11/2007 | Shaw ............................. 356/437 |
| 2009/0243610 A1 | * | 10/2009 | Ichihara et al. ............... 324/301 |

FOREIGN PATENT DOCUMENTS

| | | |
|---|---|---|
| JP | 2001-208818 A | 8/2001 |
| JP | 2009-162554 | 7/2009 |
| JP | 2009-236599 | 10/2009 |
| WO | 2009-084731 | 7/2009 |
| WO | WO 2009084731 A1 * | 7/2009 |

OTHER PUBLICATIONS

Robert Aldrich, "Laser Fundamentals", Dec. 25, 2005.*

* cited by examiner

*Primary Examiner* — Patrick Assouad
*Assistant Examiner* — Hoang X Nguyen
(74) *Attorney, Agent, or Firm* — Harness, Dickey & Pierce, P.L.C.

(57) ABSTRACT

A beam that passes through a plurality of gas cells a number of times is led to a deflection meter from a light ejecting section, detection of a deflected surface angle is performed and a strength of a magnetic field is measured by a structure in which the plurality of the gas cells is arranged along a light beam between two reflection units or light concentrating units that have a light beam incidence section and a light beam ejecting section and are opposite to each other, and a laser beam that is incident from the light beam incidence section passes through the plurality of the gas cells and then is multiply reflected by both reflection units.

3 Claims, 7 Drawing Sheets

MAGNETIC FIELD MEASURING APPARATUS

CROSS-REFERENCE TO RELATED APPLICATIONS

The entire disclosure of Japanese Patent Application No. 2009-249436, filed Oct. 29, 2009 is expressly incorporated by reference herein.

BACKGROUND

1. Technical Field

The present invention relates to a technology that measures the strength of a magnetic field.

2. Related Art

As the technology that measures the strength of a magnetic field, an atom magnetization sensor that uses an electronic spin polarization of alkali metal gas is suggested. When a pump light of a circular polarized light is irradiated with respect to a cell in which an alkali metal vapor is present and a probe light of the straight polarized light passes through the cell, the polarized light surface of the probe light rotates according to the strength of the magnetic field that is applied to the cell. Thus, the strength of the magnetic field is measured by detecting a polarization rotation angle of the probe light.

A technology has been developed such that when the strength of a magnetic field is measured, a magnetic field gradient is measured using two cells that are disposed at different positions to each other from an object being measured, because magnetic fields that are caused by terrestrial magnetism, electric noise or the like in addition to the magnetic field of the object being measured may also get measured (for example, JP-A-2009-162554).

According to the technology described in JP-A-2009-162554, even if the magnetic field that is generated from the object being measured has low strength, there is an advantage in that the magnetic field can be precisely measured. However, the measuring precision may be low when the strength of the magnetic field and the polarization rotation angle of the probe light are not in a proportionate relation. Given that an increase in the strength of the magnetic field and the maintenance of the proportionate relation cannot be performed simultaneously, the strength of all the magnetic fields in a measuring environment needs to be restrained so as not to exceed any upper limit of the strength and the measurable strength of the magnetic field of the object being measured is greatly restricted. Therefore, there is a need to use an expensive magnetic shield.

Also, the probe light is absorbed by the influence of the alkali metal vapor of the cell through which the probe light passes. There is a case where if the strength of the probe light is different when passing through the cell, the amount of change in the polarization rotation angle may be different even in a magnetic field of the same strength, so that when the absorption amount becomes large, the relation of the polarization rotation angle with respect to the magnetic field in the two cells causes them to differ from each other and the magnetic field gradient cannot be precisely measured.

SUMMARY

An advantage of some aspects of the invention is that a technology is provided in which the precision of the measuring of the magnetic field gradient using the light pumping method can be improved.

According to an aspect of the invention there is provided a magnetic field measuring apparatus includes a probe light irradiating unit that irradiates a probe light of a straight polarized light, a magnetic medium that is present in two regions through which the probe light irradiated from the probe light irradiating unit passes through and is magnetized according to a direction in which a pump light of a circular polarized light is irradiated, the magnetic medium rotating a polarized light surface of the passing probe light by Faraday effect according to a strength of a component of a first direction orthogonal to a direction in which the probe light passes through the magnetic field that is applied to each of the two regions from the outside, a light path control unit that controls the light path of the probe light so that each of the probe lights passes through the magnetic medium in each of the two regions in the same number of times, a pump light irradiating unit that irradiates a pump light of the circular polarized light with respect to the magnetic medium so that the magnetic medium is magnetized along a direction other than the first direction in each of two regions, and a detection unit that detects a difference between a rotation amount of polarized light surface of the probe light according to which the magnetic medium passes through one of two regions a number of times and a rotation amount of polarized light surface of the probe light in accordance with the magnetic medium passing through the other of two regions a number of times.

According to an aspect of the invention, even if the polarization rotation angle is small with respect to the strength of the magnetic field in each of the regions, the probe lights pass through a number of times with respect to the magnetic medium in each of the regions so that the polarization rotation angle that is detected is large and the measuring precision of the magnetic field gradient can be improved. Also, even though the polarization rotation angle may be small in one through passage, the density of the magnetic medium becomes small so that the absorption of the probe light can be small and the measuring precision of the magnetic field gradient can be further improved.

It is preferable that the light path control unit has reflection mirrors that are provided so as to insert two regions and the probe light is reflected by the reflection mirrors so that the probe light passes through each of two regions a number of times with respect to the magnetic medium.

According to the magnetic field measuring apparatus, the probe light can pass through the two regions with respect to the magnetic medium a number of times with brief configuration.

It is preferable that the light path control unit has corner cubes that are provided so as to insert two regions and the probe light is reflected by the corner cubes so that the probe light passes through each of two regions a number of times with respect to the magnetic medium.

According to the magnetic field measuring apparatus, the probe light can pass through the two regions with respect to the magnetic medium a number of times with brief configuration.

It is preferable that the probe light irradiating unit has an ejecting section that ejects the probe light, the detection unit has a light receiving section that receives the probe light and in which a polarized light surface is rotated in accordance with the magnetic medium passing through each of two regions a number of times, the ejecting section and the light receiving section are positioned in the same side with respect to the magnetic medium.

According to the magnetic field measuring apparatus, the object being measured can be positioned near one of the two regions that is away from the output section and light receiving section.

It is preferable that the magnetic field measuring apparatus further including a calculation unit which calculates a difference of strength in the component of the first direction of the magnetic fields that are applied to each of the two regions from the result of the detection by the detection unit.

According to the magnetic field measuring apparatus, the strength of the magnetic field that is generated from the object being measured that is positioned near one of the two regions can be measured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments

Overall Configuration

Figure 1:
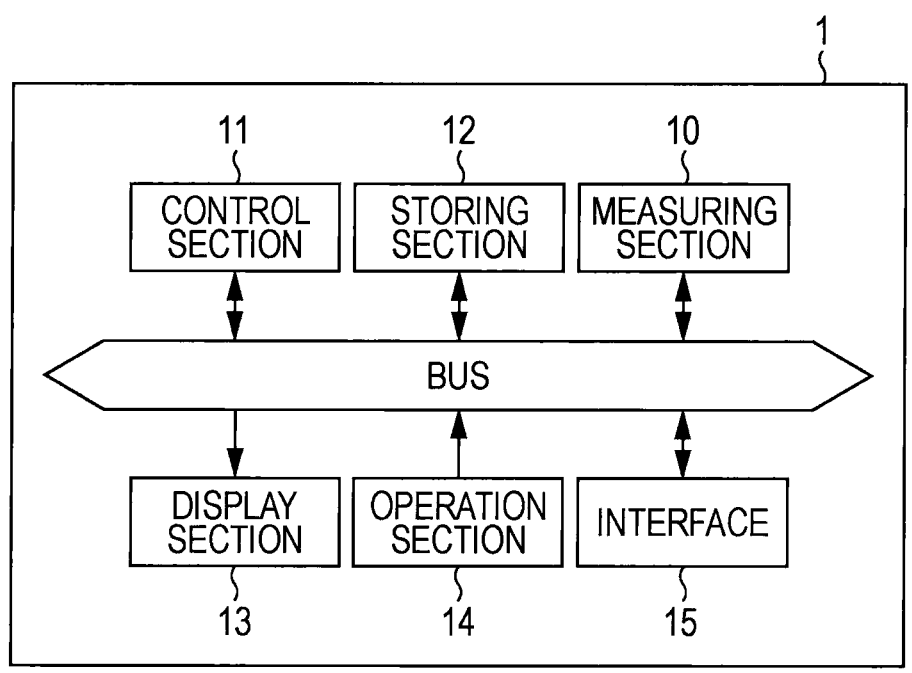
FIG. 1 is a block diagram showing a configuration of a magnetic field measuring apparatus.

FIG. 1 is a block diagram showing a configuration of a magnetic field measuring apparatus 1. The magnetic field measuring apparatus 1 is an apparatus that measures the strength of a magnetic field that is generated from an object being measured using a light pumping method, and has the measuring section 10, the control section 11, the storing section 12, the display section 13, the operation section 14 and the interface 15. The measuring section 10 has each of the configurations that measures the strength of the magnetic field and performs control of the measuring start and finish by the control section 11. The measuring section 10 outputs polarized light rotation angle information to the control section 11 during measuring. Description will be given below regarding the detail of the measuring section 10 and the polarized light rotation angle information.

The control section 11 has an arithmetic processing circuit such as CPU (Central Processing Unit) or the like, ROM (Read Only Memory), RAM (Random Access Memory), and the like, and the CPU loads a program that is stored in the ROM to the RAM and performs the program. Thus, the control section 11 performs control of each section of the magnetic field measuring apparatus 1 through a bus. Also, the control section 11 also has a function as a calculation unit that performs the calculation processing that calculates the measured strength of a magnetic field from the polarized light rotation information as described below.

The storing section 12 is a storing unit of a hard disc and nonvolatile memory, or the like, and stores all kinds of programs, the magnetic field measuring result and the like.

The display section 13 is a display device that has a display screen such as liquid crystal display or the like, and display contents are controlled by the control section 11. The display contents are all kinds of setting screen, display of the measuring results and the like, for example.

The operation section 14 has operation members such as buttons, keyboard, touch panel or the like, and data that show the operation contents are output to the control section 11 when a user operates the operation members.

The interface 15 uses a terminal such as USB (Universal Serial Bus) or the like and uses a communication function that is connected to a communication network so that it has a connecting function for exchanging information with an external apparatus.

Next, description will be given regarding the configuration of the measuring section 10.

Configuration of Measuring Section 10

Figure 2:
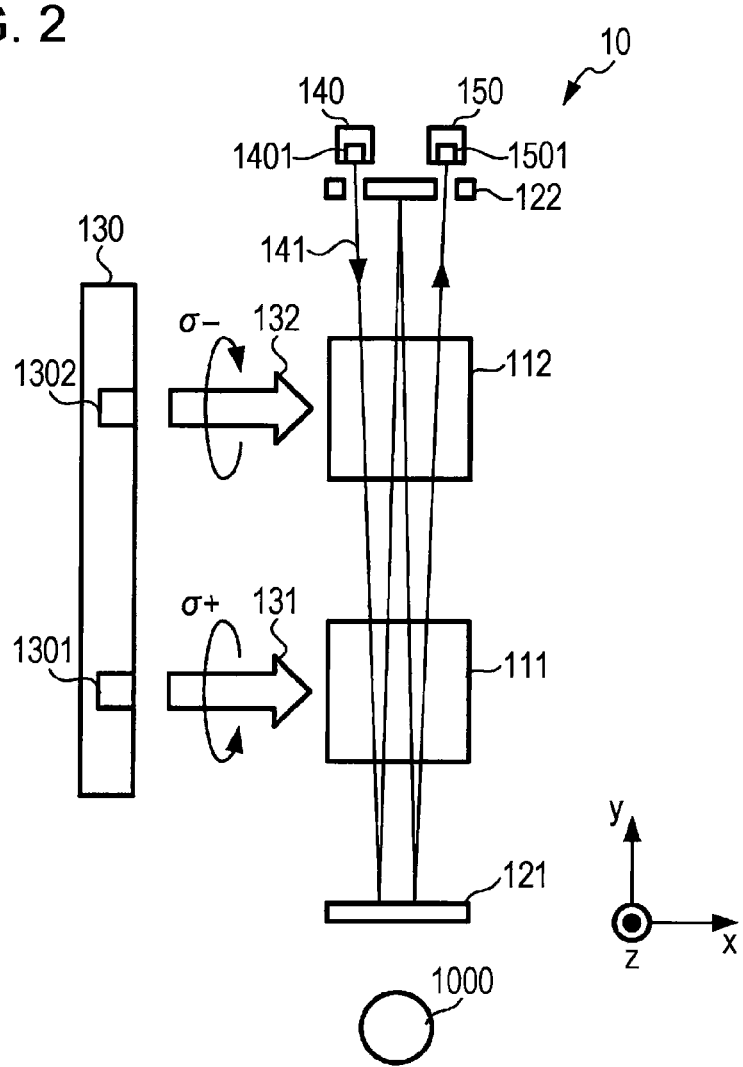
FIG. 2 is a drawing showing a configuration of a measuring section.

FIG. 2 is a drawing showing a configuration of a measuring section 10. The measuring section 10 has the first gas cell 111, the second gas cell 112, the reflecting mirrors 121 and 122, the pump light irradiating section 130, the probe light irradiating section 140 and the probe light detecting section 150. As shown in FIG. 2, description will be given wherein the right direction of the drawing is the x-axis direction, the upper direction of the drawing orthogonal with respect to the x-axis is the y-axis direction, and the vertical front direction of the paper surface orthogonal with respect to a plane of the x-axis and the y-axis is the z-axis direction. In the embodiment, the measuring section 10 is described as a configuration for measuring the strength of a magnetic field in the z-axis direction. As shown in FIG. 2, the object being measured object 1000 is positioned nearer the first gas cell 111 than the second gas cell 112 when measuring the strength of the magnetic field that is formed by the object being measured object 1000.

The first gas cell 111 and the second gas cell 112 are arranged parallel in the y-axis direction. The first gas cell 111 and the second gas cell 112 (hereinafter, simply referred to as gas cells when it is not necessary to distinguish each of them individually) are hollow members that are constituted from a material such as glass, plastic or the like through which a pump light and a probe light are passed as described below. In the hollow portion of the gas cell, a magnetic medium of an alkali metal atom such as potassium (K), rubidium (Rb), cesium (Cs) or the like is sealed. Also, rare gases such as helium (He), argon (Ar) or the like and nonmagnetic gas such as nitrogen (N) may be sealed as a buffer gas. When measuring the strength of the magnetic field, the interior of the gas cell is heated by a heating unit (not shown) and vapor of the alkali metal atom fills the interior of the gas cell and is gasified. The heating is not needed in the case of an atom density in its gasified state that is sufficient without being heated.

As the magnetic medium that is sealed within the gas cell, the alkali metal atom is used, however, as described below, the magnetic medium is not limited to the alkali metal atom, if it is magnetized according to an irradiating direction when a pump light of circular polarized light is irradiated.

As described above, the first gas cell 111 and the second gas cell 112 are maintained in two regions that are magnetic field measuring regions so that a magnetic medium is present. Thus, two gas cells are not necessarily needed, and it may be maintained in a single gas cell. The two regions that become the magnetic field measuring regions are regions in which the pump light 131 (described below) irradiates the magnetic medium within the first gas cell 111 and a region in which the pump light 132 (described below) irradiates the magnetic medium within the second gas cell 112. The regions are regions in which the pump lights 131 and 132 are irradiated. However, the regions may also include regions in which the magnetic medium that is magnetized by the pump light are continuously influenced by the magnetization, and diffused and widened.

In the description below, the first gas cell 111 and the second gas cell 112 correspond two regions that are magnetic field measuring regions. Also, the first gas cell 111 and the second gas cell 112 have the same dimensions at least in the y-axis direction, in other words, the dimensions of the two regions in the y-axis direction are the same as each other. Moreover, the first gas cell 111 and the second gas cell 112 also have the same atom density of the magnetic medium as each other. Also, the first gas cell 111 and the second gas cell 112 are not limited to the above-described configurations, if a relation between the strength of the magnetic field Bz and a polarized light rotation angle θ of the polarized light surface of the probe light 141 are the same as each other respectively as described below.

The reflecting mirrors 121 and 122 are provided so as to insert the first gas cell 111 and the second gas cell 112, and are light path control units that pass through each of probe lights 141 the same number of times (in the embodiment, four times respectively) with respect to the first gas cell 111 and the second gas cell 112 so as to reflect the probe light 141 and control the light path. The reflecting mirror 121 is provided at the first gas cell 111 side and the reflecting mirror 122 is provided at the second gas cell 112 side. Also, the reflecting mirror 122 has a configuration (that is, a introducing hole in the embodiment) in which the probe light 141 that is ejected from an ejecting section 1401 of the probe light irradiating section 140 which is outside between the reflecting mirrors 121 and 122 is guided to the inside, and the probe light 141 that is reflected by the reflecting mirrors 121 and 122, and is within the mirrors is guided to the light receiving section 1501 of the probe light detecting section 150 of the outside.

The pump light irradiating section 130 is a pump light irradiating unit that has the irradiating sections 1301 and 1302 irradiating the pump lights 131 and 132 that are pumping light in the light pumping method to the first gas cell 111 and the second gas cell 112 respectively. The pump light irradiating section 130 irradiates the pump lights 131 and 132 in the same direction respectively (irradiating in the x-axis positive direction as shown in FIG. 2). Also, the pump lights 131 and 132 are circular polarized lights respectively that are irradiated by the pump light irradiating section 130 and are circular polarized lights that rotate in the counter direction respectively. In the embodiment, the pump light 131 is a left circular polarized light (σ+: the circular polarized light that rotates clockwise (left rotation seen from the light receiving side) with respect to the light advancing direction (the x-axis positive direction)) and the pump light 132 is right circular polarized light (σ−: the circular polarized light that rotates counterclockwise (right rotation seen from the light receiving side) with respect to the advancing direction of the light (the x-axis positive direction)).

The pump light irradiating section 130 has one light source and converts the light that is generated from the light source to the pump lights 131 and 132 using an optical system such as a phase difference plate, a beam splitter, a mirror or the like, and then irradiates the light. Also, the pump light irradiating section 130 may have two light sources and light that is generated from each of the light sources may be irradiated as the pump lights 131 and 132.

The probe light irradiating section 140 is a probe light irradiating unit having the ejecting section 1401 that ejects the probe light 141 of straight polarized light. As described above, the probe light 141 is reflected in the reflecting mirrors 121 and 122, passes a number of times through the first gas cell 111 and the second gas cell 112 respectively, and reaches the light receiving section 1501 of the probe light detecting section 150. In the embodiment, the ejecting section 1401 and the light receiving section 1501 are provided in the same side with respect to the first gas cell 111 and the second gas cell 112, and in the embodiment, are provided on the side opposite the second gas cell 112 through the reflecting mirror 122. According to the above description, the object being measured 1000 can be positioned in the vicinity of the first gas cell 111 and the magnetic field from the object being measured 1000 can be effectively measured.

The probe light irradiating section 140 has a light source and the light that is generated from the light source may pass through the optical system such as a lens or the like until the probe light 141 is ejected from the ejecting section 1401.

As illustrated in FIG. 2, a light path of the probe light 141 is not completely parallel but substantially parallel with the y-axis and the parallel is assumed in the description below.

The probe light detecting section 150 has the light receiving section 1501 that receives the probe light 141 and is a detecting unit that detects the polarized light rotation angle of the received probe light 141. For example, the probe light detecting section 150 may use a polarized light beam splitter and a photo detector, or may use a polarimeter.

The probe light detecting section 150 sets in advance a state of the polarized light surface of the probe light 141 that is irradiated from the probe light irradiating section 140, measures that how many times the polarized light surface of the probe light 141 that is received at the light receiving section 1501 is rotated in which the polarized light surface is reference, and detects the rotation amount as the polarized light rotation angle.

The polarized light rotation angle that is detected as described above is indicated as a difference between the rotation amount of the polarized light surface of the probe light 141 by the first gas cell 111 and the rotation amount of the polarized light surface of the probe light 141 by the second gas cell 112, as a result of the probe light 141 passing a number of times through the first gas cell 111 and the second gas cell 112 as described below.

The probe light detecting section 150 detects the polarized light rotation angle information indicating the detected polarized light rotation angle to the control section 11. Next, description will be given regarding the magnetization change in the magnetic medium that is sealed in the first gas cell 111 and the second gas cell 112.

Figure 3:
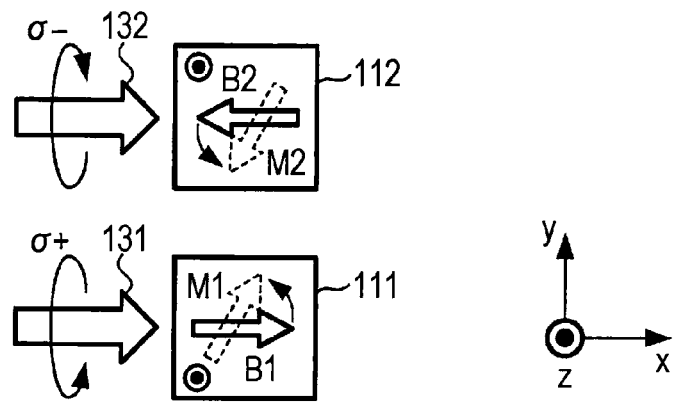
FIG. 3 is an illustrative view showing a magnetization change of a magnetic medium in a first gas cell and a second gas cell.

FIG. 3 is an illustrative view showing a magnetization change in a magnetic medium in the first gas cell 111 and a second gas cell 112. The magnetic medium such as alkali metal or the like in the gas cell is magnetized in which when the light of the circular polarized light is irradiated, an electron spin polarization of the alkali metal atom is generated in accordance with the light advancing direction. In a case where the irradiated light is left circular polarized light (σ+), magnetization is along the light advancing direction, while in a case where the irradiated light is right circular polarized light (σ−), magnetization is in the reverse of the light advancing direction. Such a phenomenon is referred to as light pumping. Thus, when the light irradiation is stopped, the spin polarization is diminished and is directed in a random direction so that a magnetization vector becomes small with the elapse of time. The speed at which the spin polarization is generated and magnetization is decreased to a specific ratio (for example, 1/e) is a lateral diminishing speed Γg.

Here, as shown in FIG. 3, the pump light 131 of left circular polarized light (σ+) is irradiated in the x-axis positive direction at the first gas cell 111 so that the magnetic medium is magnetized in the x-axis positive direction at the first gas cell 111 (magnetization vector M1). Meanwhile, the pump light 132 of right circular polarized light (σ−) is irradiated in the x-axis negative direction at the second gas cell 112 so that the magnetic medium is magnetized in the x-axis negative direction at the second gas cell 112 (magnetization vector M2).

Also, when the magnetic field is applied to the magnetic medium at the first gas cell 111 and the second gas cell 112, the electron spin starts a Larmor processional motion and rotates within the surface that is vertical to the applied magnetic field direction. The Larmor frequency $\omega_L$ is proportionate to the size of the applied magnetic field and $\omega_L = \gamma B$ ($\gamma$: magnetic rotation ratio, B: strength of applied magnetic field).

As shown in FIG. 3, a magnetic field B1 is applied to the first gas cell 111 in the z-axis positive direction and a magnetic field B2 is applied to the second gas cell 112 in z-axis positive direction. The direction in which the magnetic field is applied is in practice not limited to the z-axis positive direction and description is given focusing on the z-axis positive direction component of the strength of the magnetic field.

When the magnetic field is applied in the z-axis positive direction, the magnetization vector is rotated (rotated counterclockwise within the xy plane, the xy plane as seen from the z-axis positive direction) by the Larmor processional motion. Thus, the magnetization vector is rotated and the size thereof becomes small with the elapse of time.

Next, as the result, description will be given regarding the magnetization size generated in the y-axis direction.

Figure 4:
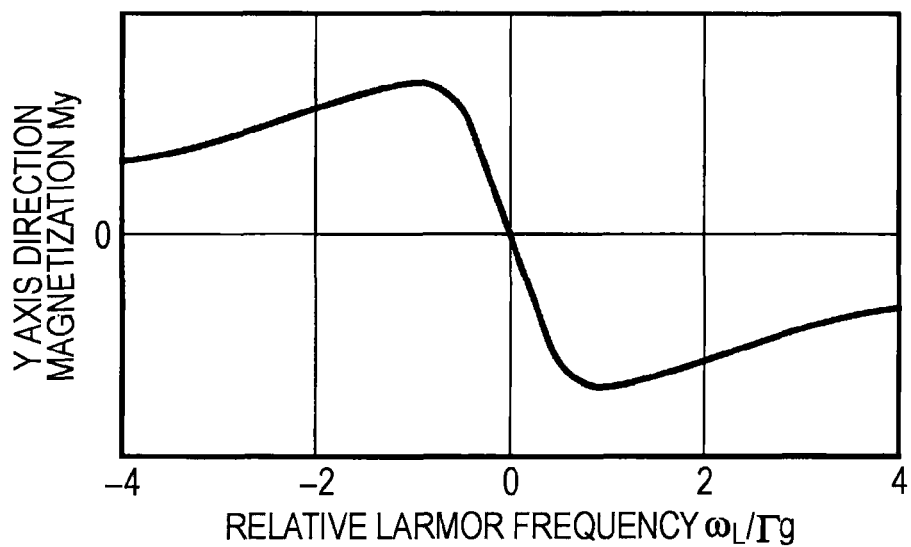
FIG. 4 is a drawing showing a relation between relative Larmor frequency and y-axis direction magnetization.

FIG. 4 is a drawing showing a relation between a relative Larmor frequency and the y-axis direction magnetization My. The relative Larmor frequency is present as Larmor frequency $\omega_L$/lateral diminishing speed Γg. The magnetization My of the y-axis direction is represented as My=$-C\omega_L \Gamma g/(\omega_L^2 \Gamma g^2)$, and shows the size of the magnetization vector of the y-axis direction that is generated by the rotation thereof on the basis of the magnetization vector (corresponding to the magnetization vector M2) toward the x-axis negative direction. C is a constant that is determined according to the strength of the probe light 141 and the density of the magnetic medium within the gas cell. Also, $\omega_L$ makes the counterclockwise rotation seen from z-axis positive direction within xy plane as a positive value.

In the state in which the magnetic medium within the gas cell is magnetized, the polarized light surface of the probe light is rotated by the Faraday effect when the probe light 141 passes through the magnetic medium. Specifically, the polarized light surface is rotated clockwise with respect to the advancing direction according to the size of magnetization along the direction in which the probe light 141 is advanced. In other words, when the probe light 141 is advanced in the y-axis positive direction, the polarized light surface of the probe light 141 is rotated according to the polarization size in the y-axis direction of magnetic medium within the passing gas cells. As described above, the magnetization size in the magnetic medium within the gas cells is changed according to the strength of the magnetic field that is applied as shown in FIG. 4. Accordingly, the polarized light surface of the probe light 141 is rotated according to the strength of the magnetic field that is applied to magnetic medium within the gas cells from the outside.

Next, description will be given regarding the relation between the strength of the magnetic field that is applied from the outside and the rotation amount (the polarized light rotation angle) of the polarized light surface of the probe light 141.

Figure 5:
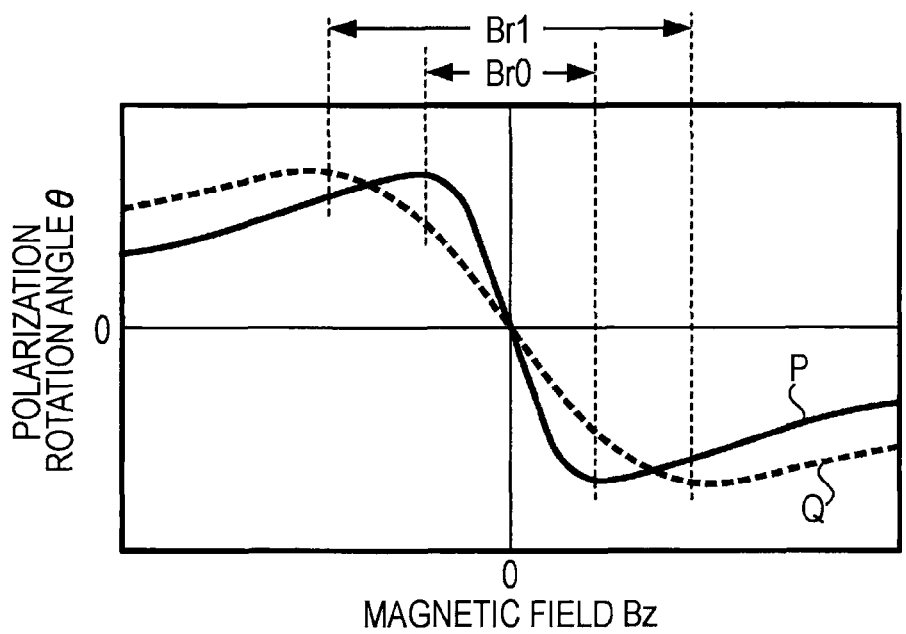
FIG. 5 is a drawing showing a relation between the strength of a magnetic field that is applied and a polarized light rotation angle.

FIG. 5 is a drawing showing the relation between the strength of a magnetic field Bz that is applied and a polarized light rotation angle θ. The magnetic field Bz shows the strength of the magnetic field that is applied in the z-axis positive direction. The polarized light rotation angle θ defines the counterclockwise direction with respect to the advancing direction of the probe light 141 as positive. In other words, in a case where the advancing direction of the probe light 141 and the magnetization vector of the y-axis direction are the same direction, the polarized light surface of the probe light 141 is rotated clockwise with respect to the advancing direction according to the size of the magnetization vector, while in the case of the opposite direction, it is rotated counterclockwise.

Also, a solid line P and a dot line Q are assumed such that the atom density of the magnetic mediums are different to each other and the atom density of the dot line Q is lower than that of the solid line P.

The solid line P is described with reference to FIG. 5. When an absolute value of the strength of the magnetic field Bz becomes large, the polarized light rotation angle θ proportionally becomes large, and the proportionate relation is maintained only when the strength of the magnetic field Bz is within a magnetic field measuring range Br0. Thus, regarding the strength of the magnetic field Bz outside the magnetic field measuring range Br0, measurement cannot be performed exactly. The magnetic field measuring range Br0 is determined by Br0=2Γg/γ, since the absolute value of the Larmor frequency $\omega_L$/Γg shown in FIG. 4 is substantially less than 1.

Meanwhile, regarding the dot line Q, the atom density of the magnetic medium is low and thus Γg becomes large so that the change of the polarized light rotation angle θ with respect to the change in the strength of the magnetic field Bz becomes small. In other words, the atom density becomes low and then sensitivity with respect to the magnetic field Bz becomes low so that the magnetic field measuring range can be widened from Br0 to Br1.

Next, description will be given regarding the rotation of the polarized light surface of the probe light 141.

Rotation of Polarized Light Surface of Probe Light 141

FIGS. 6A to 6H are illustrative views showing the rotation of the polarized light surfaces by passing through the gas cells of the probe light 141. The magnetic field B0 is applied in the z-axis positive direction to the second gas cell 112 and the magnetic field B0+Bh is applied in the z-axis positive direction to the first gas cell 111. The difference between the magnetic fields occurs through the difference between the distances from the object being measured 1000 to the first gas cell 111 and to the second gas cell 112. The magnetic fields B0 and B0+Bh are within the above-described magnetic field measuring range.

A magnetization vector M2y of the y-axis direction in the magnetic medium of the second gas cell 112 is directed toward the y-axis negative direction and a magnetization vector M1y of the y-axis direction in the magnetic medium of the first gas cell 111 is directed toward the y-axis positive direction by the magnetic fields B0 and B0+Bh. Since the magnetic field with regard to the first gas cell 111 is larger than the magnetic field with regard to the second gas cell 112, the size of the magnetization vector M1y is larger than that of the magnetization vector M2y. In other words, the absolute value (hereinafter, referred to as the first polarized light rotation angle $\alpha$) of the polarized light rotation angle $\theta$ of the probe light 141 in the first gas cell 111 is larger than the absolute value (hereinafter, referred to as the second polarized light rotation angle $\beta$) of the polarized light rotation angle $\theta$ of the probe light 141 in the second gas cell 112.

In the embodiment, description is given in the case where the probe light 141 advances to the y-axis negative direction (referred to as probe light 141-1), passes through the second gas cell 112 and the first gas cell 111, and then is reflected by the reflecting mirror 121, advances to the y-axis positive direction (referred to as probe light 141-2), passes through the first gas cell 111 and the second gas cell 112. Moreover, FIGS. 6A to 6H show the direction of the polarized light surface with respect to the advancing direction of the probe light 141. In FIGS. 6A to 6H, the clockwise rotation with respect to the advancing direction of the probe light 141 is defined as positive.

Figure 6:
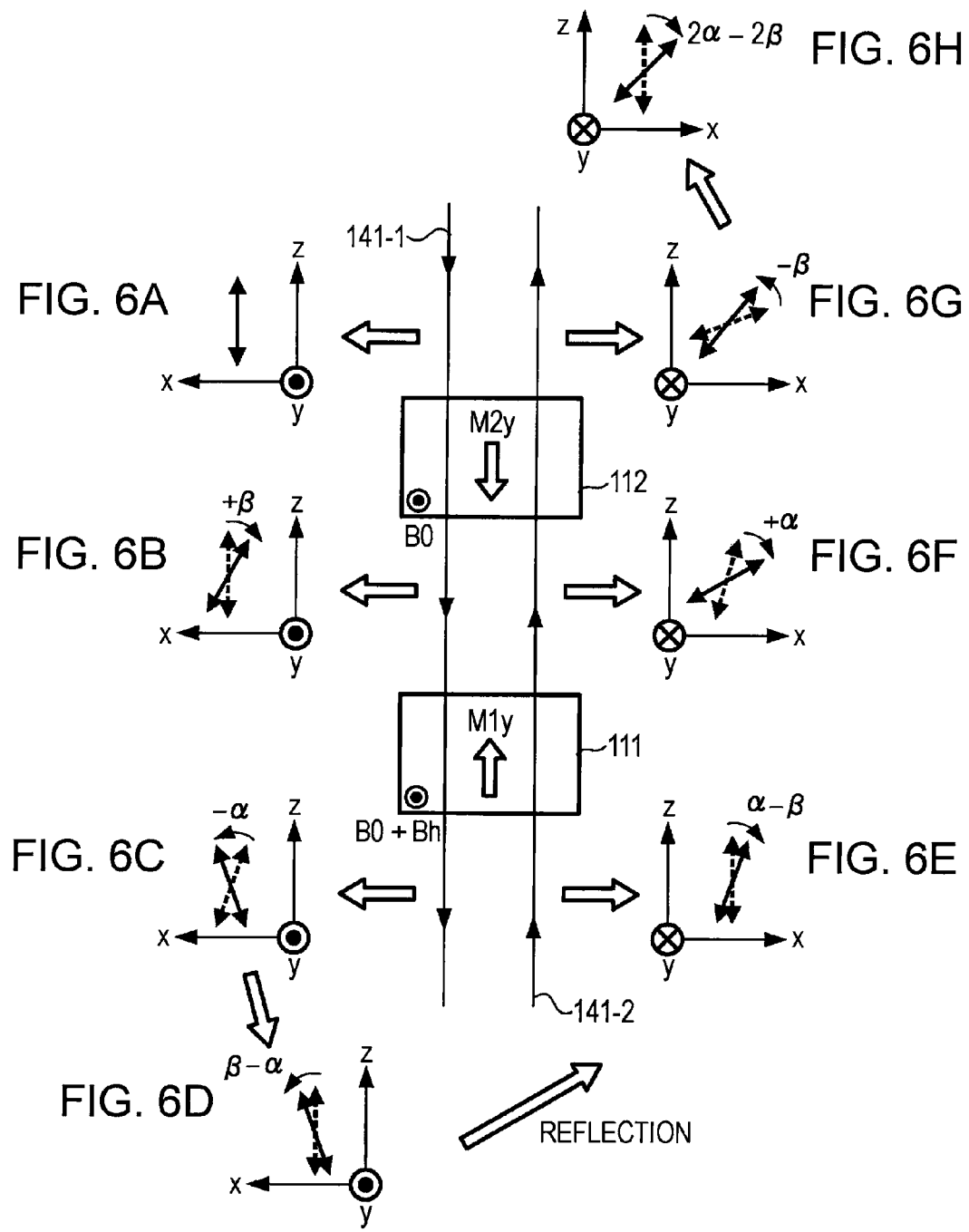
FIGS. 6A to 6H are illustrative views showing rotation of a polarized light surface by the passing of a probe light through gas cells.

First of all, before the probe light 141-1 passes through the second gas cell 112, as shown in FIG. 6A, the polarized light surface of the probe light 141-1 is along the z-axis. When the probe light 141-1 passes through the second gas cell 112, as shown in FIG. 6B, the polarized light surface rotates by +$\beta$ ($\beta$ in clockwise rotation with respect to the advancing direction of the probe light 141-1) since the advancing direction of the probe light 141-1 and the direction of the magnetization vector M2y are in the same direction as each other. When the probe light 141-1 further passes through the first gas cell 111, as shown in FIG. 6C, the polarized light surface rotates by −$\alpha$ ($\alpha$ in counterclockwise rotation with respect to the advancing direction of the probe light 141-1) because the advancing direction of the probe light 141-1 and the direction of magnetization vector M1y are in the opposite direction to each other.

Accordingly, as shown in FIG. 6D, the polarized light surface of the probe light 141-1 that passed through the second gas cell 112 and the first gas cell 111 rotates by $\beta$-$\alpha$ compared to before the passing through is performed. The polarized light rotation angle ($\beta$-$\alpha$) corresponds to that of the magnetic field Bh.

Next, when the probe light 141-1 is reflected by the reflecting mirror 121, the advancing direction is reversed to the y-axis positive direction (the probe light 141-2). Thus, the phase of probe light rotates 180° and as shown in FIG. 6E, the polarized light surface with respect to the advancing direction rotates by the polarized light rotation angle ($\alpha$-$\beta$) with respect to the original polarized light surface shown in FIG. 6A.

When the probe light 141-2 passes through the first gas cell 111, as shown in FIG. 6F, the polarized light surface rotates by +$\alpha$ ($\alpha$ in clockwise rotation with respect to the advancing direction of the probe light 141-2) because the advancing direction of the probe light 141-2 and the direction of the magnetization vector M1y are in the same direction as each other. Also, when the probe light 141-2 further passes through the second gas cell 112, as shown in FIG. 6G, the polarized light surface rotates by −$\beta$ ($\beta$ in counterclockwise rotation with respect to the advancing direction of the probe light 141-2) because the advancing direction of the probe light 141-2 and the direction of magnetization vector M2y are in the opposite direction to each other.

Accordingly, as shown in FIG. 6H, the probe light 141 that passed through the second gas cell 112 and the first gas cell 111, reflected by the reflecting mirror 121 and then passed again through the first gas cell 111 and the second gas cell 112, rotates the polarized light surface by 2$\alpha$-2$\beta$ compared to before passing through is performed. The polarized light rotation angle 2$\alpha$-2$\beta$ corresponds to twice the polarized light rotation angle $\alpha$-$\beta$ with respect to the magnetic field Bh.

In a case where the probe light 141 is irradiated as shown in FIG. 2, the rotation of the above-described polarized light surface is performed once more, so that the polarized light rotation angle becomes 4$\alpha$-4$\beta$ and then becomes four times the polarized light rotation angle $\alpha$-$\beta$ with respect to the magnetic field Bh.

The polarized light rotation angle $\alpha$-$\beta$ with respect to the magnetic field Bh becomes a small rotation angle as the atom density of the magnetic medium in the gas cell is low and the magnetic field measuring range is widened. For example, when the atom density is $\frac{1}{16}(=(\frac{1}{4})^2)$, the magnetic field measuring range becomes four times, in other words, the polarized light rotation angle becomes ¼ even in a magnetic field of the same strength. In the configuration of the embodiment, the number of through passes wherein the probe light 141 is reflected by the reflecting mirrors 121 and 122 and passed through the first gas cell 111 and the second gas cell 112 is a number of times (four times), so that the polarized light rotation angle can be obtained four times even in a magnetic field of the same strength.

Also, the number of through passes wherein the probe light 141 passed through the first gas cell 111 and the second gas cell 112 a number of times, so that the strength of the probe light 141 is also decreased, however in the embodiment, the decreasing of the strength of the probe light 141 can be small, since the atom density of the magnetic medium is low in the first gas cell 111 and the second gas cell 112 to widen the magnetic field measuring range.

In the embodiment, the probe light 141 has the configuration in which the probe light 141 passes through the first gas cell 111 and the second gas cell 112 as a set that is related to the measuring of the magnetic field gradient, and then reflected by the reflecting mirrors 121 and 122. Thus, the difference between the strength of the probe light 141 when the probe light 141 passes through the first gas cell 111 or the second gas cell 112 and the strength of the probe light 141 when the probe light 141 passes through the next gas cell is small, so that influence thereof on the measuring is small. If the decreasing amount is known beforehand, the decreasing amount of the polarized light rotation angle can be amended since the polarized light rotation angle is decreased according to the decreasing amount. Accordingly, even in the case where the decreasing amount of the strength of the probe light 141 accumulates and becomes large while the probe light 141 is ejected from the ejecting section 1401 and received in the light receiving section 1501, the influence thereof on the measuring is small.

As the result of the detection, the control section 11 obtains the polarized light rotation angle information that is calculated from the measuring section 10, and calculates the strength of magnetic field Bh that is the difference between the magnetic field B0+Bh that is applied to the magnetic medium in the first gas cell 111 and the magnetic field B0 that is applied to the magnetic medium in the second gas cell 112. According to the above-described strength, the strength of the magnetic field that is generated by the object being measured 1000 can be measured.

Specifically, the relation between the magnetic field Bz and the polarized light rotation angle $\theta$ corresponding to FIG. 5 is stored in the control section 11 and the polarized light rotation angle that is indicated in the polarized light rotation angle information is ¼ so that the corresponding strength of magnetic field may be calculated. As described above, in a case where the amendment is performed taking into consideration the strength of the probe light 141, the polarized light rotation angle that is indicated in the polarized light rotation angle information is not ¼, but may be 1/(4−c), using amendment value c for example.

As described above, the magnetic field measuring apparatus 1 according to the embodiment of the invention reflects the probe light 141 using the reflecting mirrors 121 and 122 at the measuring section 10 and passes through the first gas cell 111 and the second gas cell 112 a number of times so that the polarized light rotation angle in the probe light 141 can be large. At this time, the atom density of the magnetic medium in the first gas cell 111 and the second gas cell 112 becomes small so that the decreasing amount of the probe light 141 can be suppressed and the magnetic field measuring range can be increased.

Modified Embodiment

As described above, description has been given concerning the embodiment of the invention, however the invention can be modified in various examples as described below.

First Modified Example

In the above-described embodiment, the ejecting section 1401 and the light receiving section 1501 are positioned in the same side with respect to the first gas cell 111 and the second gas cell 112, however they may be positioned in different sides to each other.

Figure 7:
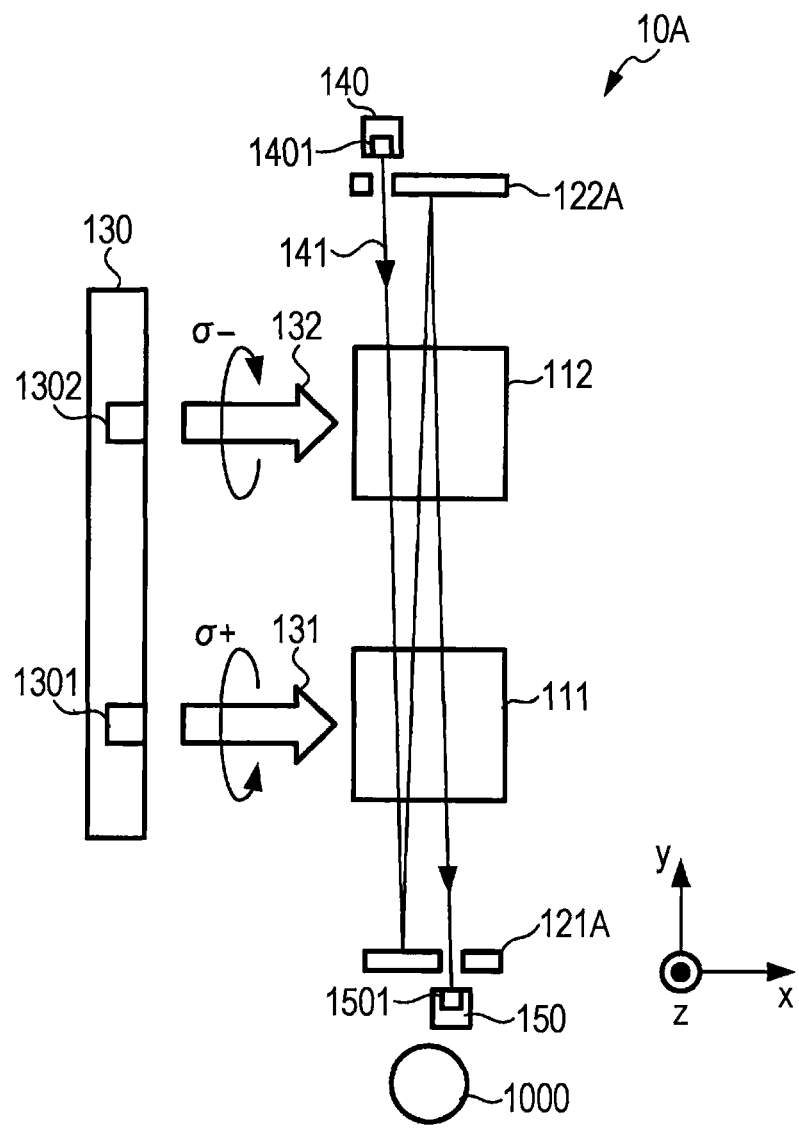
FIG. 7 is a drawing showing a configuration of a measuring section according to a first modified example.

FIG. 7 is a drawing showing a configuration of a measuring section 10A according to a first modified example. The measuring section 10A uses the reflecting mirrors 121A and 122A instead of the reflecting mirrors 121 and 122 of the measuring section 10 in the embodiment, and the position of the light receiving section 1501 is on the side opposite to the position of the ejecting section 1401 through the first gas cell 111 and the second gas cell 112.

In the case of this configuration, the relation between positive and negative of the y-axis direction is different when the light receiving section 1501 receives the probe light 141, so that the process is performed reversing positive and negative as the above-described embodiment when the polarized light rotation angle information is processed in the control section 11.

Second Modified Example

In the above-described embodiment, the reflecting mirrors 121 and 122 are used as the light path control units, however a unit other than the reflection mirrors may control the light path of the probe light 141.

Figure 8:
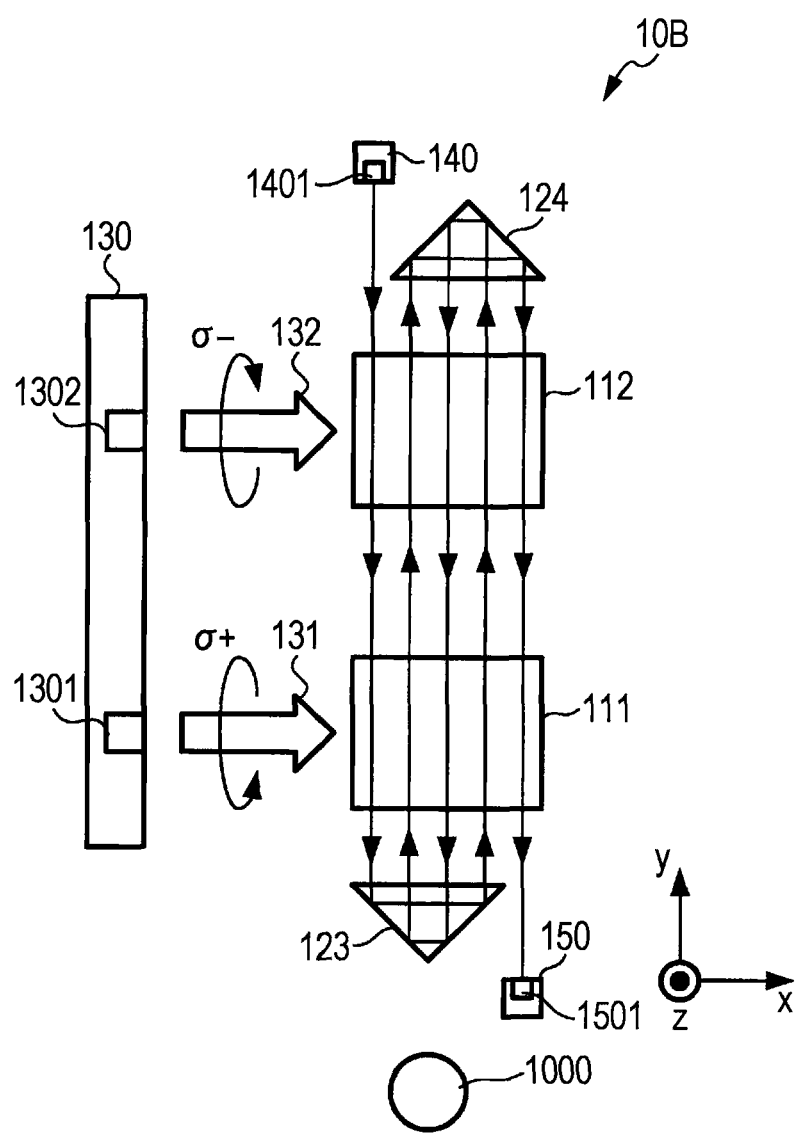
FIG. 8 is a drawing showing a configuration of a measuring section according to a second modified example.

FIG. 8 is a drawing showing a configuration of a measuring section 10B according to a second modified example. The measuring section 10B uses right angle prisms 123 and 124 instead the reflecting mirrors 121 and 122 of the measuring section 10 of the embodiment. Even in this configuration, the probe light 141 can pass through the first gas cell 111 and the second gas cell 112 a number of times.

When the advancing direction of the probe light 141 is changed in 180° by the right angle prisms 123 and 124, the right angle prisms 123 and 124 may be constituted so as to rotate the phase of the probe light 141 180° similarly to the reflecting mirrors 121 and 122 of the embodiment. Also, the right angle prisms 123 and 124 themselves do not constitute the example but other optical systems may separately be provided in the measuring section 10B to realize such configuration.

Also, the reflection surfaces of the right angle prisms 123 and 124 are two, however the reflection surface of either of the right angle prisms 123 and 124 may be three of corner cube.

Third Modified Example

In the above-described embodiment, the pump lights 131 and 132 irradiate in the same direction as each other and the direction of the circular polarized lights are different to each other, however the directions of the circular polarized lights may be in the same direction as each other and the irradiation directions may be in the opposite direction to each other. For example, the pump lights 132 may be left circular polarized light the same as the pump light 131 and the irradiation direction may be the x-axis negative direction.

Also, the invention is not limited to the example, and when the pump lights 131 and 132 irradiate to the first gas cell 111 and the second gas cell 112 respectively, the invention may have a configuration such that each of the magnetization directions of the magnetic mediums may be opposite to each other.

Accordingly, the pump light irradiating section 130 may have a configuration in which as the result of the probe light 141 passing through the first gas cell 111 and the second gas cell 112 a number of times, the polarized light rotation angle that is detected at the probe light detecting section 150 becomes the difference between the rotation amount of the polarized light surface of the probe light 141 through the first gas cell 111 and the rotation amount of the polarized light surface of the probe light 141 through the second gas cell 112.

Fourth Modified Example

In the embodiment as described above, when the pump lights 131 and 132 irradiate the first gas cell 111 and the second gas cell 112 respectively, the example has a configuration such that the magnetization directions of the magnetic mediums are opposite to each other, however the pump lights 131 and 132 may be left circular polarized light together so that the magnetization directions may be the same as each other and a half-wavelength plate may be used.

Figure 9:
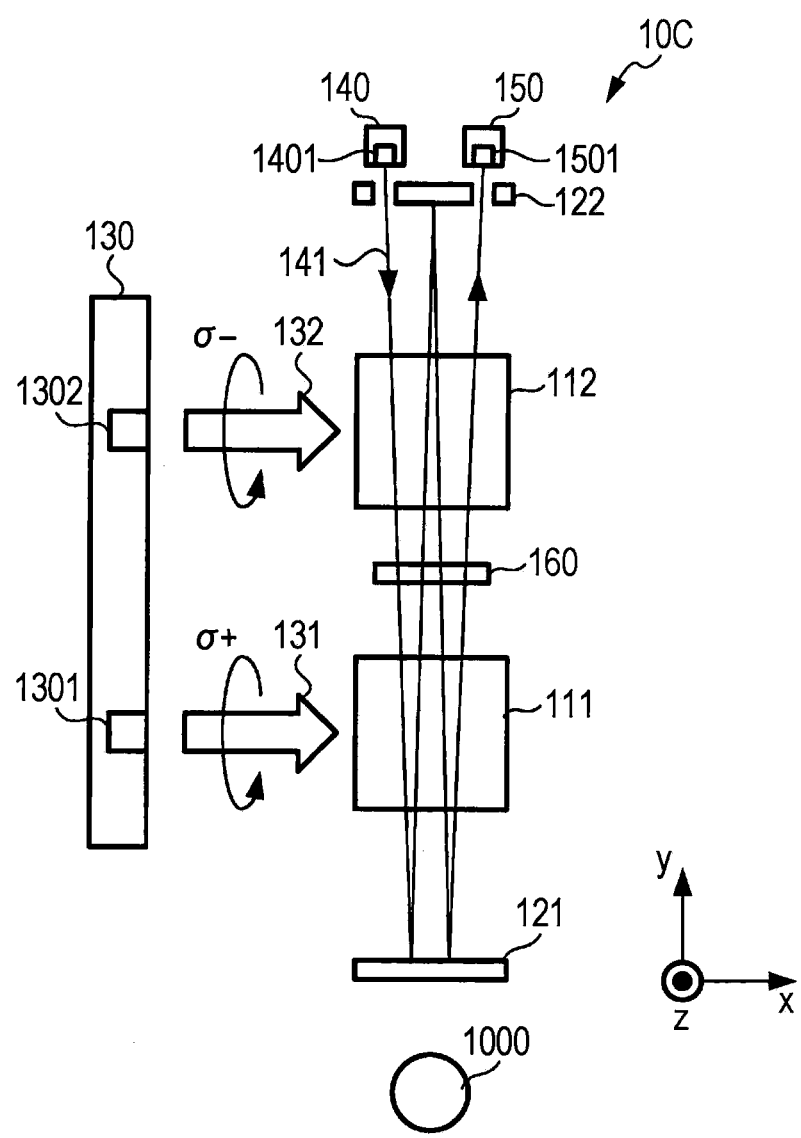
FIG. 9 is a drawing showing a configuration of a measuring section according to a fourth modified example.

FIG. 9 is a drawing showing a configuration of a measuring section 10C according to a fourth modified example. The measuring section 10C may use a half-wavelength plate 160 at a region on which the probe light 141 between the first gas cell 111 and the second gas cell 112 passes through. Thus, when the probe light 141 passes the half-wavelength plate 160, the phases are deviated 180°, so that the rotation directions of the polarized light surface of the probe light 141 in the first gas cell 111 and the second gas cell 112 can be opposite to each other and the effect can be the same as the embodiment.

Accordingly, a configuration in which the rotation of the polarized light surface of the probe light 141 is controlled may be provided therein as the result that the probe light 141 passes the first gas cell 111 and the second gas cell 112 a number of times, the polarized light rotation angle that is detected at the probe light detecting section 150 becomes the difference between the rotation amount of the polarized light surface of the probe light 141 by the first gas cell 111 and the rotation amount of the polarized light surface of the probe light 141 by the second gas cell 112.

What is claimed is:

1. A magnetic field measuring apparatus comprising:
a probe light irradiating unit that irradiates a probe light beam in a first direction, the probe light beam having a straight polarization;
a pump light irradiating unit that irradiates first and second pump light beams in a second direction that is different from the first direction, the first and second pump light beams having first and second circular polarizations, respectively;
first and second magnetic mediums through which the probe light beam passes, the first and second magnetic mediums being magnetized with respect to a polarization direction of the first and second circular polarizations,
a light path control unit that controls a light path of the probe light beam so that the number of passage times of the probe light beam through the first and second magnetic mediums are the same, and
a detection unit that receives the probe light beam and that detects a difference between first and second rotation amounts of first and second polarized light surfaces of the probe light beam, wherein
the first magnetic medium rotates the first polarized light surface of the probe light beam according to first strength of a first component in a perpendicular direction perpendicular to the first direction of an externally applied magnetic field that is applied to the first magnetic medium by Faraday effect,
the second magnetic medium rotates the second polarized light surface of the probe light beam according to second strength of the first component in the perpendicular direction of the externally applied magnetic field that is applied to the second magnetic medium by Faraday effect,
the probe light irradiating unit, the detection unit, and the first and second magnetic mediums are located along the first direction, and the probe light irradiating unit and the detection unit are located at the same side next to one of the first and second magnetic mediums,
the light path control unit includes first and second reflection mirrors between which the first and second magnetic mediums are located, the reflection mirrors reflect the probe light beam so that the probe light beam passes through the first and second magnetic mediums the same number of times, the first reflection mirror is located directly adjacent to the probe light irradiating unit, the detection unit and the one of the first and second magnetic mediums, and the second reflection mirror is located directly adjacent to the other of the first and second magnetic mediums, and
the detection unit detects the difference between the first and second rotation amounts of the first and second polarized light surfaces of the probe light beam in consideration of a decreasing amount of strength of the probe light beam.

2. The magnetic field measuring apparatus according to claim 1, wherein
the light path control unit has corner cubes, and
the corner cubes reflect the probe light beam so that the probe light beam passes through the first and second magnetic mediums the same number of times.

3. The magnetic field measuring apparatus according to claim 1, further including:
a calculation unit that calculates a difference between the first strength and the second strength.

* * * * *